United States Patent [19]

Knigge et al.

[11] Patent Number: 4,493,857

[45] Date of Patent: Jan. 15, 1985

[54] METHOD FOR APPLYING A COATING TO A THIN BOARD

[75] Inventors: Rolf Knigge, Hamburg; Wolfgang Albien, Pinneberg, both of Fed. Rep. of Germany

[73] Assignee: Howaldtswerke-Deutsche Werft Aktiengesellschaft Hamburg und Kiel, Hamburg, Fed. Rep. of Germany

[21] Appl. No.: 448,813

[22] Filed: Dec. 10, 1982

[30] Foreign Application Priority Data

Dec. 15, 1981 [DE] Fed. Rep. of Germany ....... 3149588

[51] Int. Cl.$^3$ ............................................. B05D 1/28
[52] U.S. Cl. .................................... 427/96; 427/211; 427/378; 427/428
[58] Field of Search .............. 427/209, 211, 96, 378, 427/428; 118/227, 228, 239, 316, 324, 58

[56] References Cited

U.S. PATENT DOCUMENTS 3,343,977  9/1967  Gjesdal ............................. 427/209
3,535,157 10/1970  Steinhoff et al. ................... 117/212

Primary Examiner—Evan K. Lawrence
Attorney, Agent, or Firm—Nils H. Ljungman

[57] ABSTRACT

In a method and device for applying and subsequently drying a coating on a thin rigid board, the board is conveyed in vertical position, either hanging from or standing on the conveyor. The boards are clamped at one marginal zone, which preferably extends in a direction of horizontal advance. In a coating unit applicator rolls are positioned on both sides of the path of the boards. The applicator rolls rotate on vertical axes. The coating liquid is fed to the applicator rolls by vertical slot orifice nozzles. In the drying zone nozzles and heaters for drying the coating are arranged symmetrically to treat both surfaces uniformly and to stabilize the vertical position of the boards. The method and device are particularly useful in applying a light sensitive coating to basic materials in the production of printed circuit boards.

4 Claims, 5 Drawing Figures

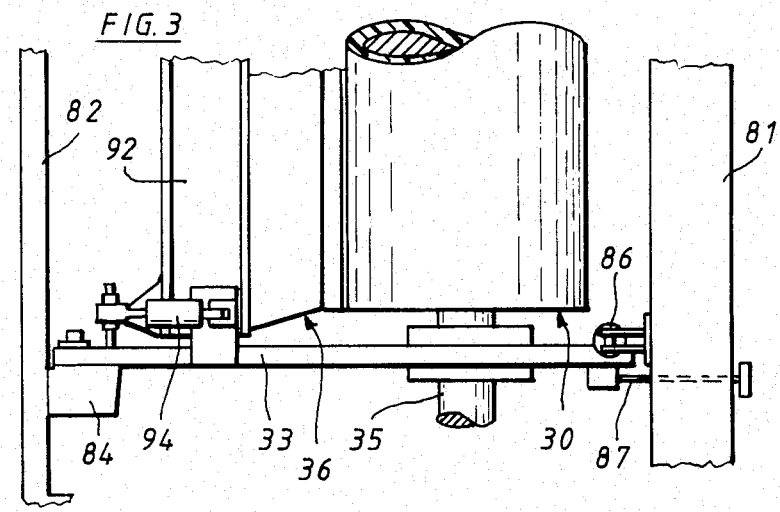
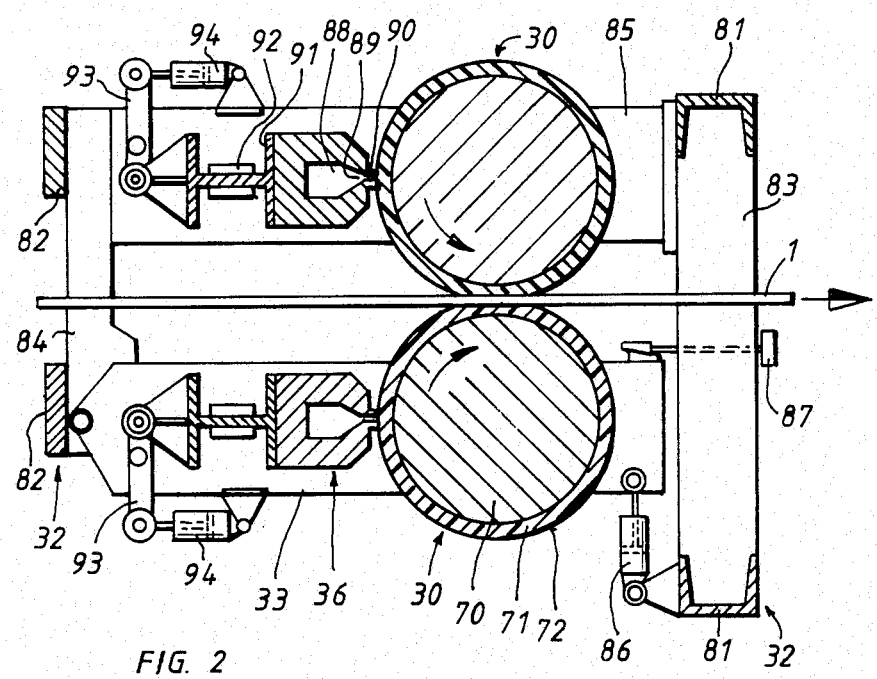

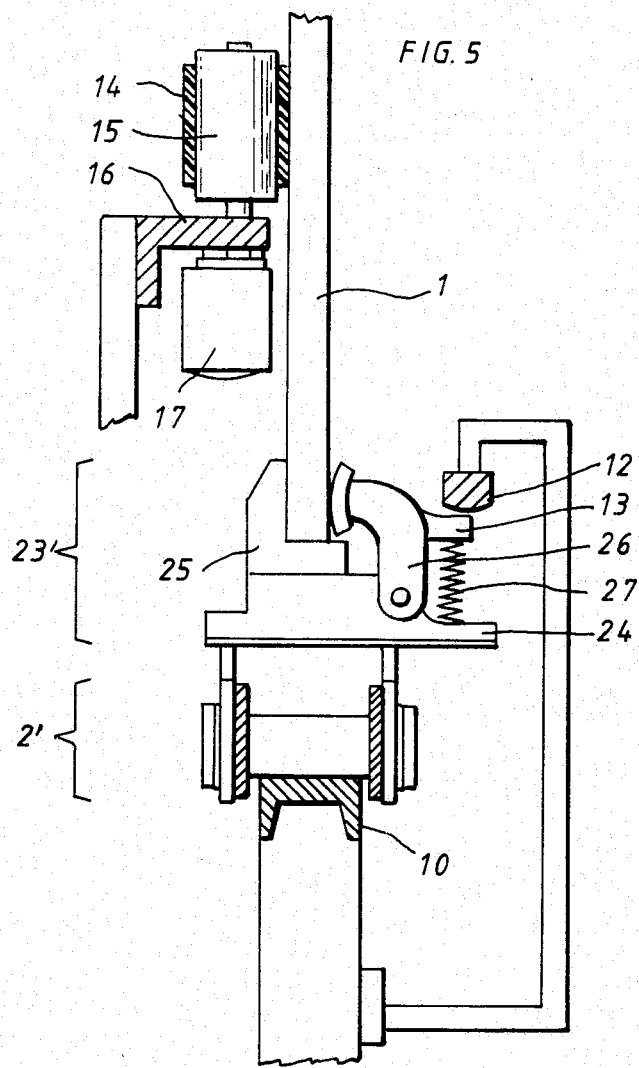

METHOD FOR APPLYING A COATING TO A THIN BOARD

BACKGROUND OF THE INVENTION

The invention relates to a method for applying a coating to the surface of a thin rigid board or a similar structure. The invention is particularly useful for coating base materials in the production of circuit boards with fluid resist.

Usually the basic boards for printed circuit boards have a length of about 185 to 600 mm and a width of about 145 to 350 mm and are 0.2 to 4 mm thick. The basic boards comprise resin-bonded paper or synthetic resins reinforced by glass fibres or similar composite materials and are relative rigid. They are provided with a thin layer of copper on which a fluid photoresist lacquer is to be applied as a light sensitive coating. The coating is 0.004 or 0.008 mm thick and any thickness between these values and also thicker and thinner coatings may be required. The boards have one edge for handling which remains uncoated. This uncoated marginal zone should not be broader than 10 mm. If the boards are handled in horizontal position gripped only on the narrow marginal zone it can break off or the boards will bend thereby preventing uniform treatment of all parts of a surface. Very often the boards are to be coated on both sides so that they cannot be supported by rolls, guide bars or the like before the coating is sufficiently dry. Supporting the boards by air streams will result in different quality of the dried coatings on both surfaces. But is is already difficult to obtain coatings of identical thickness on both surfaces if the board is coated in horizontal position simultaneously or in two steps.

DESCRIPTION OF PRIOR ART

It is well known in the prior art to apply coating liquids to films, sheets and boards by applicator rolls rotating on horizontal axes. In U.S. Pat. No. 3,535,157 (granted to Steinhoff) a method and a device for applying a viscous liquid solution of a light sensitive material to a basic board in the production of printed circuit boards is described. The boards are moved horizontally between an applicator roll and a support roll or between two applicator rolls. Especially boards coated on both sides require manual handling before the coating is sufficiently dry. One of the disadvantages of such practices is that it is impossible to prevent dust particles from adhering to the fresh coatings which particles make the circuit boards unacceptable.

SUMMARY OF THE INVENTION

Known prior art arrangements had some potential disadvantages such as difficulties in gripping the uncoated marginal zone of the boards moved in a horizontal plane, in supporting and drying boards coated on both sides and because of dust particles falling down to the upper horizontal surface of the coated boards before the coating is substantially dry.

The present invention in its broad concept comprises a method for applying a liquid coating composition to one or simultaneously to both surfaces of a thin rigid board and subsequently drying the coating, whereby the board is carried and treated in a vertical position, in which it is gripped at one edge, in a coating unit and a drying compartment, and whereby any pressure and heating, e.g. during coating and drying, directed to one vertical coated surface of the board is compensated by equal pressure and heating directed to the other vertical surface. Rolls, nozzles for ejecting compressed media and heating means are symmetrically provided on both sides of the path of the board so that a vertical position is maintained and plane surfaces with uniform distribution and homogeneous state of the coating are achieved. Because of the vertical position of the board dust particles cannot fall down on the coated surface.

In a preferred device used in the method of the present invention the boards are conveyed continuously on a horizontal path whereby they are gripped on a narrow edge that extends in the direction of advance and they are hanging or standing on the conveyor which is provided with gripping means. In the coating unit of the device a roll with a resilient surface is placed on each side of the path of the conveyor. The rolls are rotating on vertical axes. One of the rolls is an applicator roll provided with a surface that can transfer a coating liquid to the surface of the boards. The other roll is a support roll for maintaining the board in vertical position while the coating is applied. If both surfaces are to be coated the second roll is an applicator roll as well. In the drying zone into which the boards are conveyed subsequently, nozzles are positioned symmetrically on both sides of the path of the conveyor for blowing heated dry and clean gas such as air against the surface of the boards whereby they are heated and dried uniformly and supported in vertical position which results in plane coated surfaces.

An applicator roll similar to that described in U.S. Pat. No. 3,535,157 may be used. The applicator roll comprises a hard material having a resilient covering the surface of which contains a multiplicity of depressions or corrugations forming reservoirs for the liquid coating composition. However, this applicator roll is, according to the present invention, arranged in a vertical position, and for supplying the liquid coating composition to the applicator roll a slot orifice nozzle is preferred. The supply nozzle extends vertically over the applicator roll and the edges or lips of the nozzle are in contact with the resilient surface of the applicator roll, so that the coating liquid is introduced essentially only into the depressions. The nozzle is adjustable, and the lips have a function like a doctor blade to define the amount of coating liquid transferred by the applicator roll. The support roll is preferably identical with the applicator roll, but no means for supplying a coating liquid are necessary or are in use if only one surface is coated. Rolls as described are especially preferred for the coating of boards which are provided with through-holes which have to remain free of the liquid coating.

BRIEF DESCRIPTION OF THE DRAWINGS

FIG. 2 is a schematic horizontal cross-section of a coating unit which may be used in the device according to FIG. 1.

FIG. 3 is a schematic longitudinal view of the lower part of the coating unit according to FIG. 2.

FIG. 5 is a schematic vertical cross-section of details of feeding and clamping station of a device according to FIG. 4.

DESCRIPTION OF PREFERRED EMBODIMENTS

A preferred method of practicing the invention will be disclosed in connection with the illustrated apparatus.

Figure 1:
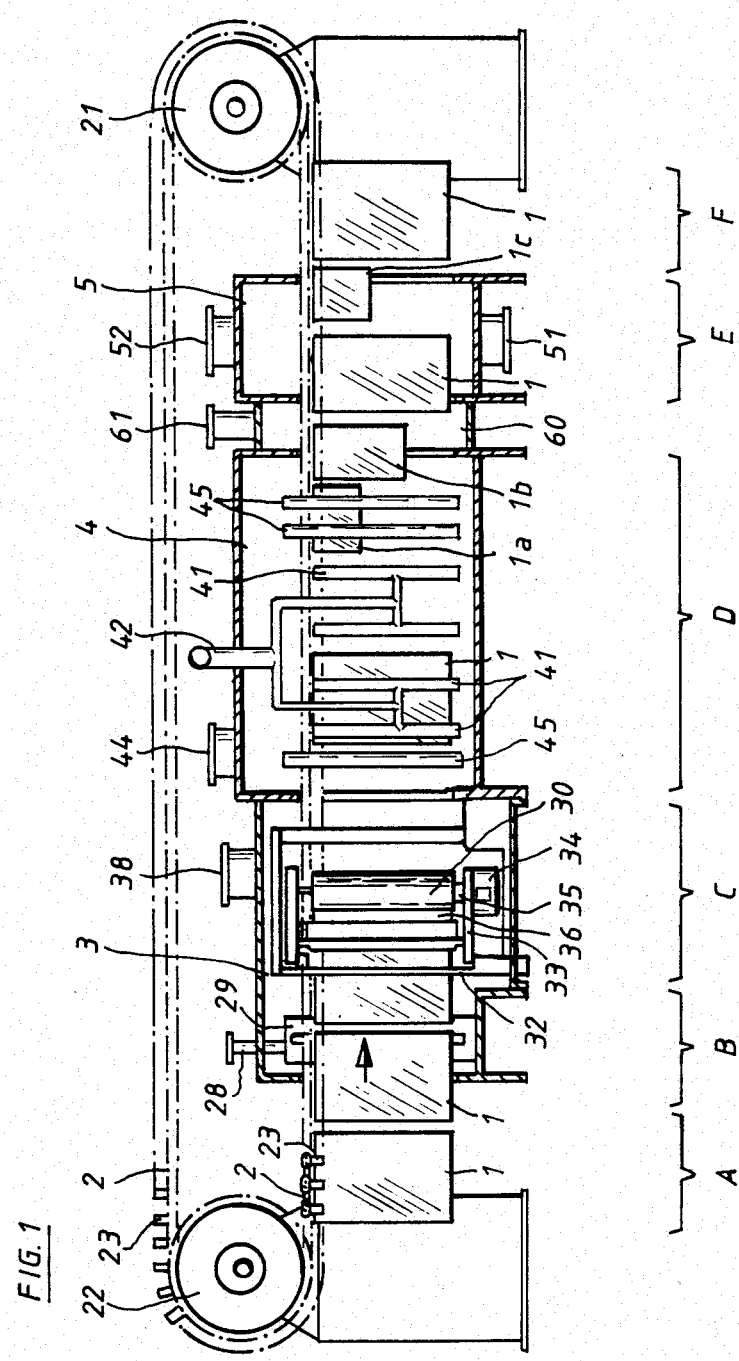
FIG. 1 is a longitudinal diagrammatic view of a device for applying and drying a fluid coating on boards hanging vertical on a conveyor, whereby a section inside of one wall of the compartments is shown.

The device according to FIG. 1 comprises a feeding and clamping station A, a dust removal station B, a coating unit C, a drying zone D, a cooling zone E, and a feed out station F. Dust removing station B and coating unit C are placed in a first compartment 3, the drying zone D is in a second compartment 4, and the cooling zone E is in a further compartment 5. A conveyor 2, which is preferably a sprocket chain conveyor, runs through all stations and zones continuously. The conveyor is provided with clamping means such as gripping tongs 23 to carry boards 1,1a, 1b, 1c of different size, in a vertical hanging position. The conveyor is driven by a sprocket wheel 21 and is returned by another sprocket wheel 22. A motor (not shown) rotates the sprocket wheel 21 with infinitely variable speed. The returning part of the sprocket chain runs outside the compartments.

In the feeding-in station A the boards 1, which are cleaned before but may be contaminated e.g. by dust, are attached manually or mechanically to the gripping tongs 23 which are closed before leaving the feeding-in station A and entering into the first compartment 3.

The dust removal station B is provided with deionizing bars (not shown) and suction hoods 29 for double sided dust removal from the boards. Dust particles are exhausted through pipe 28.

The coating unit C in compartment 3 comprises on either side of the path of the boards respectively of the conveyor an applicator roll 30 having a resilient surface with depressions for transferring a fluid coating composition to the vertical surfaces of the board 1 if the board is to be coated on both sides. The applicator rolls 30 are variably driven by motors 34. A nozzle 36 of slot orifice type is provided for each of the applicator rolls 30. The slot of this nozzle 36 is vertical as well and extends over the height of the rolls 30 which rotate on vertical axes 35. At least one of the applicator rolls 30 is mounted on levers 33 pivoted in a frame 32. Further details of the coating unit are described in combination with FIGS. 2 and 3.

The drying zone D in compartment 4 comprises a multiplicity of nozzles 41 for blowing heated air or gas against the vertical surfaces of the boards. Heating means 45 such as infrared heaters are arranged there as well. Nozzles and heating means are positioned symmetrically on either side of the path of the boards to maintain the vertical position of the boards and to heat the boards uniformly on both surfaces thereby avoiding any warpage of the boards or of the coating.

Through a transition zone 60 the boards are conveyed into the cooling zone E in compartment 5, into which cold air is introduced through pipe 51 and removed through pipe 52. Finally the boards reach the feeding out station F, where the gripping tongs are opened and the boards can be removed from the conveyor manually or mechanically. When the boards leave the compartment 5 the coating has hardened sufficiently to permit handling. If a complete curing of the photoresist lacquer is required, a long drying and heating zone can be used.

In compartment 3 the pressure of the air is slightly higher than in the room surrounding the device and than in compartment 4. Through pipe 38 fresh clean air, free of any dust is introduced into compartment 3.—Into the transition zone 60 clean air is introduced through pipe 61.— In the drying compartment 4 the pressure of the air is preferably lower than in the adjacent compartments, and air including solvent from the applied coating composition is removed through pipe 44. Some of the heated air of compartment 4 is circulated by fans (not shown) and blown through pipe 42 and nozzles 41 against the surfaces of the boards 1, whereas fresh air enters into compartment 4 through the openings for conveying the boards from compartments 3 and 60, and a mixture of fresh air and air containing solvent is constantly removed through pipe 44 to maintain a low pressure in compartment 3 which is enclosed in a dust-proof housing.

In FIGS. 2 and 3 the frame 32 of the coating unit comprises uprights 81 and 82 and cross-bars 83 and 84. In the shown example on one side of the path of the board 1 a longitudinal bar 85 extends between cross-bars 83 and 84 and supports one applicator roll 30. On the other side a lever 33 is pivoted on cross-bar 84. Means for controlling the position of the second applicator roll 30 on lever 33 with respect to the first one are provided such as a pneumatic cylinder element 86, which can press the second applicator roll against the board 1 respectively against the other roll 30; micrometer stop means 87 limit the motion of the lever 33 to set the gap between the rollers 30 according to the board thickness.

The applicator rolls 30 comprise a body 70 of hard material such as steel, and a resilient cover 71 of rubber or the like. The outer surface 72 of the applicator roll 30 is provided with small depressions or grooves preferably in the form of threads. In an example the diameter of the body 70 was 136 mm, the thickness of the resilient cover was about 12 mm, and about 18 threads per 10 mm were cut 0.2 mm deep into the rubber surface 72. The applicator roll was used for applying a light sensitiv coating which was 0.008 mm thick after drying. For other coatings different rolls may be used.

As can be seen in FIG. 2 and 3 a slot orifice type nozzle 88 is mounted parallel to each of the applicator rolls 30 and can be moved against the surface of the rolls 30 by which the slot 89 is closed so that the coating liquid is introduced only into the depressions in the resilient surface 72. The lips 90 of the nozzle remain in contact with the resilient surface 72 and work like a doctor blade to limit the amount of coating liquid to be transferred by the applicator rolls 30. The nozzle 88 is disposed on a vertical bar 91 which is movable in guides 92 and can be moved by a lever 93 pivoted on the longitudinal bar 85 respectively on the lever 33 by pneumatic cylinder units 94.

Each of the rolls 30 having resilient surfaces 72 effects a support for the other one thereby maintaining the boards in exact vertical position. Some deformation of the resilient surfaces 72 is required for transferring the coating liquid. Any deviations in the thickness of the boards are compensated by the pneumatic cylinder element 86, and the amount of coating liquid applied to the boards is adjusted by the pneumatic cylinder units 94, and by means for adjusting the pressure of the liquid (not shown).

A system for circulating and heating the coating liquid supplied to the nozzles may be provided, but is not shown in the drawings.

Figure 4:
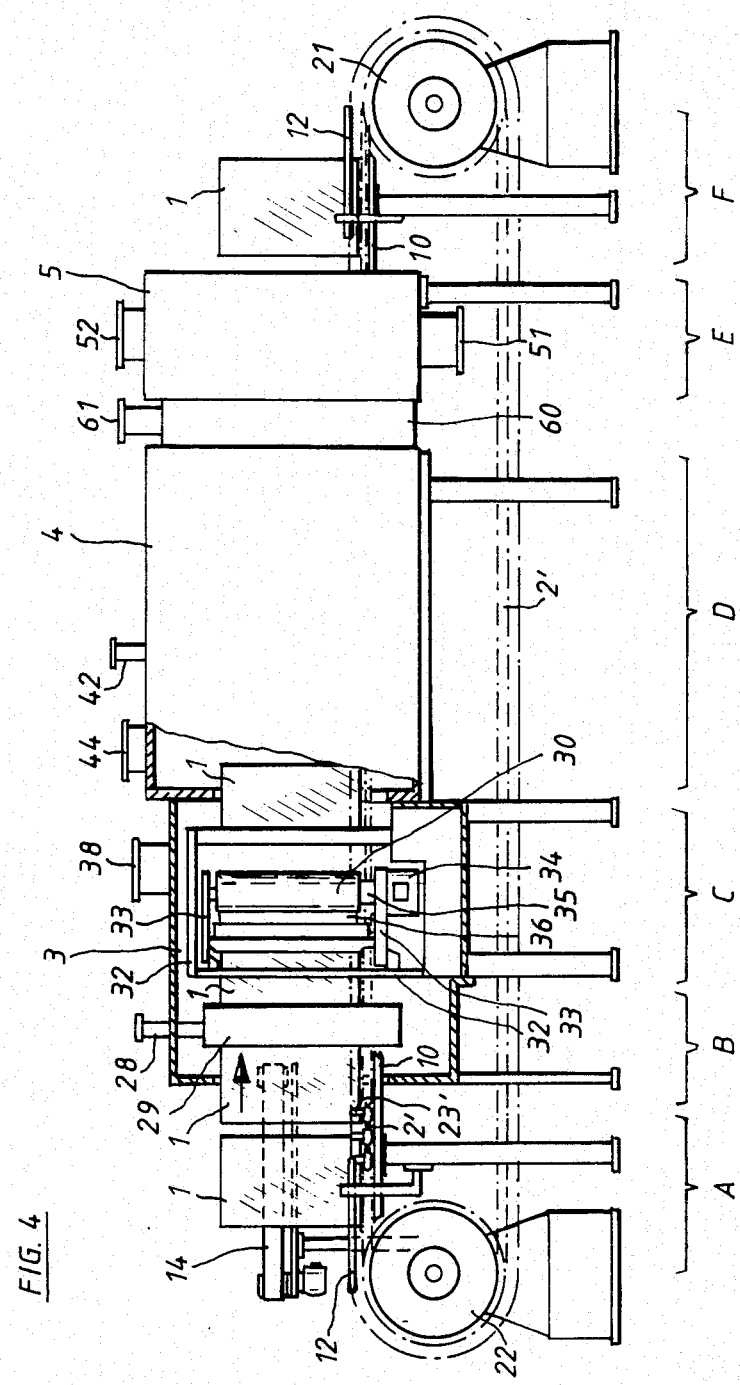
FIG. 4 is a longitudinal diagrammatic view of a device for applying and drying a coating on boards standing vertical on a conveyor showing a sectional view of the coating unit as well.

The device according to FIG. 4 is in principle the same as that in FIG. 1, and the parts of the device are essentially the same as described before and the same reference numbers are used insofar. However in this embodiment the conveyor 2' runs below the path of the boards 1. This reduces the danger that dust particles adhering to the conveyor can pass over on the coated surfaces before the coating is dried. The boards 1 are conveyed standing vertical an gripping tongs 23' mounted on the sprocket chain 2' and the chain 2' is supported by a guide 10. The coating unit C and all other stations and zones are essentially the same as described before except that they have to stand on several uprights so that the returning part of the chain 2' can run below the compartments.

As can be seen in FIG. 5 in the feeding-in station A a supporting conveyor 14 is positioned on one side of the boards 1 placed on the gripping means so that the boards are kept in vertical position until the gripping tongs clamp them sufficiently and preferably until the treatment of the boards begins in the dust removal station B. The support conveyor runs on vertical rolls 15 driven by a motor 17 mounted on a bar 16.

In FIG. 5 there is shown further an example of gripping tongs 23' comprising a basic part 24, a steel square 25 supporting a board 1 in vertical position, a clamping lever 26 and a compression spring 27 for pressing the clamping lever 26 against the board 1. The clamping lever 26 has a finger 13, and a guide rail 12 is shaped so that it can press on the finger 13 to open the clamping lever 26 for inserting and in station F also for removal of the board 1.

Similar means for clamping the boards can be used in the device according to FIG. 1 as well.

Treating the boards in a vertical position results in uniform coating layers, and in addition the direct combination of a coating unit and a drying compartment in both of which an atmosphere free of dust particles is circulated increases the output of boards with unobjectionable coatings.

If a second coating is required a second coating unit followed by a second drying zone and a second cooling zone can be arranged before the feeding-out station with, the conveyor running through all stations and zones.

It will be appreciated that the present invention provides an effective method of applying a coating to the surface of a thin board and subsequently drying the coating. The board is brought to a vertical position and has an edge affixed to conveying means. The board is transported and treated in a vertical position in a coating unit and a subsequent drying unit. Compensation for any pressure or heating directed to one vertical surface of the board is provided by pressure and heating directed to the opposite surface by providing pressure means and heating means symmetrically on both sides of the path of the board.

The invention is not restricted to coating circuit boards, and the invention is not to be taken as limited to all the details thereof described hereinabove, since modifications and variations thereof may be made without departing from the scope of the invention.

What is claimed is:

1. A method for applying a coating to the surface of a thin rigid board and subsequently drying the coating, comprising bringing the board in a vertical position and affixing one edge of it to conveying means; conveying and treating said board in a vertical position in a coating unit and a subsequent drying unit, and compensating any pressure and heating directed to one vertical surface of said board by equal pressure and heating directed to the opposite surface by providing pressure means and heating means symmetrically on both sides of the path of said board so that a plane and vertical position of the surface is substantially maintained during treatment.

2. A method according to claim 1 in which a coating is applied simultaneously to both vertical surfaces of a board.

3. A method according to claim 1 in which the boards are basic boards in the production of printed circuit boards and the coating is a fluid photoresist lacquer.

4. A method according to claim 1 wherein
said conveying of said board is in a horizontal path, and
affixing to said conveying means as said one edge a narrow generally horizontally oriented edge which extends in the direction of advance.

* * * * *